US010126376B1

United States Patent
Nguyen et al.

(10) Patent No.: US 10,126,376 B1
(45) Date of Patent: Nov. 13, 2018

(54) QUARTZ MAGNETOMETER HAVING A QUARTZ RESONANT PLATE WITH A BROADEN DISTAL END FOR ENHANCED MAGNETIC SENSITIVITY

(71) Applicant: HRL Laboratories, LLC, Malibu, CA (US)

(72) Inventors: Hung Nguyen, Los Angeles, CA (US); Logan D. Sorenson, Calabasas, CA (US); Raviv Perahia, Calabasas, CA (US); David T. Chang, Calabasas, CA (US); Joshua A. Erbland, Brockport, NY (US)

(73) Assignee: HRL Laboratories, LLC, Malibu, CA (US)

( * ) Notice: Subject to any disclaimer, the term of this patent is extended or adjusted under 35 U.S.C. 154(b) by 19 days.

(21) Appl. No.: 14/997,160

(22) Filed: Jan. 15, 2016

Related U.S. Application Data (60) Provisional application No. 62/104,227, filed on Jan. 16, 2015.

(51) Int. Cl.
*G01R 33/028* (2006.01)
*H01L 41/09* (2006.01)
*H01L 41/047* (2006.01)

(52) U.S. Cl.
CPC ........ *G01R 33/0283* (2013.01); *H01L 41/047* (2013.01); *H01L 41/09* (2013.01)

(58) Field of Classification Search
CPC ............................. H01L 41/1136; H03H 9/17
See application file for complete search history.

(56) References Cited

U.S. PATENT DOCUMENTS

| | | |
|---|---|---|
| 6,429,652 B1 | 8/2002 | Allen |
| 7,555,938 B2 | 7/2009 | Bargatin |
| 7,830,074 B2 * | 11/2010 | Kubena ................. H04R 17/10 310/348 |
| 8,569,937 B1 | 10/2013 | Kubena |
| 8,912,711 B1 | 12/2014 | Chang |
| 8,933,759 B1 | 1/2015 | Kubena |

(Continued)

OTHER PUBLICATIONS

Sunier, R., et al., "Resonant Magnetic Field Sensor With Frequency Output," Journal of Microelectromechanical Systems, vol. 15, No. 5, pp. 1098-1107, Oct. 2006.*

(Continued)

*Primary Examiner* — Noam Reisner
(74) *Attorney, Agent, or Firm* — Ladas & Parry (57) ABSTRACT

A resonator and/or a magnetometer has a resonating structure which is naturally resonant in at least one resonant mode, the resonating structure being significantly wider at a free end thereof than it is at a fixed end thereof, the resonating structure having at least one pair of sense electrodes disposed on opposing major surfaces of the resonating structure and having a conductive path formed as a loop, the loop being disposed near or at edges of the resonating structure so that the loop follows a path which is significantly wider at the free end of the resonating structure than it is at the fixed end of the resonating structure and wherein the at least one pair of sense electrodes are formed inwardly of the edges of the resonating structure and also inwardly of the path of the loop.

22 Claims, 7 Drawing Sheets

(56) References Cited

U.S. PATENT DOCUMENTS

| | | | |
|---|---|---|---|
| 2008/0100176 A1* | 5/2008 | Haskell | G01H 11/08 |
| | | | 310/313 R |
| 2012/0306321 A1 | 12/2012 | Ishii | |
| 2013/0313947 A1 | 11/2013 | Chen | |
| 2014/0049256 A1 | 2/2014 | Smith | |
| 2015/0188030 A1* | 7/2015 | Andosca | H01L 41/1136 |
| | | | 310/319 |
| 2015/0263432 A1 | 9/2015 | White | |
| 2016/0079884 A1* | 3/2016 | Lange | B81B 3/0086 |
| | | | 310/300 |

OTHER PUBLICATIONS

U.S. Appl. No. 14/628,182, filed Feb. 20, 2015, Nguyen.

U.S. Appl. No. 14/997,203, filed Jan. 15, 2016, Sorenson.

U.S. Appl. No. 14/997,423, filed Jan. 15, 2016, Nguyen.

Antonio, D. et al., "Micromechanical magnetometer using an all-silicon nonlinear torsional resonator," Applied Physics Letters 95, 133505 2009 (4 pages).

Bahreyni, Behraad, et al.,"A Resonant Micromachined Magnetic Field Sensor," IEEE Sensors Journal, vol. 7, No. 9, Sep. 2007, pp. 1326 to 1334.

Herrera-May, A L, et al.,"A resonant magnetic field microsensor with high quality factor at atmospheric pressure," J. Micromechanics Microengineering, 19 (2009) 015016 (12 pages).

Nguyen, Hung D., et al., "UHF Piezoelectric Quartz MEMS Magnetometers Based on Acoustic Coupling of Flexural and Thickness Shear Modes," MEMS 2015, Estoril, Portugal, Jan. 18-22, 2015, pp. 944-947.

Thompson, M.J. "Low Power 3-axis Lorentz Force Navigation Magnetometer,", MEMS 2011, Cancun, Mexico, Jan. 23-27, 2011, pp. 593-596.

Wickenden, Dennis, et al. "Development of Miniature Magnetometers," Johns Hopkins APL Technical Digest, vol. 18, Num. 2 (1997), pp. 271-278.

Younis, Mohammad I. "Multi-Mode Excitation of a Clamped-clamped Microbeam Resonator" Nonlinear Dynamics, vol. 80, No. 3 (May 2015), pp. 1531-1541. doi:10.1007/ s11071-015-1960-1.

Zhang, Xuehui; Wang, Huaxiang; Chen, Shenghua; Zhang, Yan, "FPGA-Based Multi-Frequency Excitation and Modulation Technology in EIT System" in 2010 3rd International Conference on Biomedical Engineering and Informatics (BMEI 2010), pp. 907-911.

U.S. Appl. No. 13/910,039, filed Jun. 4, 2013, Gregoire.

U.S. Appl. No. 15/083,190, filed Mar. 28, 2016, Perahia.

* cited by examiner

QUARTZ MAGNETOMETER HAVING A QUARTZ RESONANT PLATE WITH A BROADEN DISTAL END FOR ENHANCED MAGNETIC SENSITIVITY

CROSS REFERENCE TO RELATED APPLICATIONS

This Application claims the benefit of U.S. Provisional Patent Application Ser. No. 62/104,227 filed 16 Jan. 2015 and entitled "Quartz Micro-Magnetometer with Trapezoidal Quartz Resonant Plate for Enhanced Magnetic Sensitivity" the disclosure of which is hereby incorporated herein by reference.

This Application is related to U.S. Provisional Patent Application Ser. No. 61/943,213 filed 21 Feb. 2014 and entitled "A Micro-Scale Piezoelectric Resonating Magnetometer" and to U.S. patent application Ser. No. 14/628,182 filed 20 Feb. 2015 and entitled "A Micro-Scale Piezoelectric Resonating Magnetometer". The disclosure of these two applications are also hereby incorporated herein by reference.

This Application is also related to U.S. patent application Ser. No. 14/997,423 filed on the same date as this application and entitled "A Piezoelectric Magnetometer Capable of Sensing a Magnetic Field in Multiple Vectors", the disclosure of which is hereby incorporated herein by reference.

This Application is also related to U.S. patent application Ser. No. 14/997,203 filed on the same date as this application and entitled "FM Demodulation System for Quartz MEMS Magnetometer", the disclosure of which is hereby incorporated herein by reference.

The technology disclosed in this application is related to the technology of U.S. Pat. No. 7,830,074 entitled "Integrated quartz oscillator on an active electronic substrate", the disclosure of which is hereby incorporated herein by reference.

STATEMENT REGARDING FEDERALLY SPONSORED RESEARCH OR DEVELOPMENT

None.

TECHNICAL FIELD

This invention relates to a piezoelectric resonating magnetometer for detecting magnetic fields, the sensor preferably being of micro-scale and preferably suitable for use in (portable and/or low power) Global Positioning System (GPS) navigation devices. The disclosed sensor may be manufactured using Micro Electro Mechanical System (MEMS) techniques, but the invention as disclosed is not conceptually limited to being of a micro-scale in size or being manufactured using MEMS techniques. The sensor has a broaden tip or end and a loop electrode in addition to sense electrodes to provide enhanced magnetic sensitivity.

BACKGROUND

Prior art involving silicon resonant magnetometers suffer from poor sensitivity and moderate detection limits above 1 µT. In contrast, autonomous navigation systems that use position, navigation, and time units (PNTs) in conjunction with GPS applications need sensitive magnetometers wherein a minimum desired detection angle of 0.1° (in terms of resolving capability) translates to a minimum detectable magnetic field of under 50 nT.

Additionally, prior art silicon resonators are known to exhibit high temperature dependence, resulting in low stability of the measurement, whereas quartz resonators can be manufactured in various temperature-insensitive crystal cuts (AT cuts and SC cuts are preferred). Moreover, the high stability of co-fabricated MEMS quartz oscillators can be exploited to stabilize the measurement of the MEMS magnetometer. So a MEMS quartz oscillator may be advantageously disposed on the same substrate as the magnetometer disclosed herein.

The prior art includes: "Development of Miniature Magnetometers" Dennis K. Wickenden, Thomas J. Kistenmacher, Robert Osiander, Scott A. Ecelberger, R. Ben Givens, and John C. Murphy, *Johns Hopkins APL Technical Digest*, Vol. 18, Num. 2 (1997) 271.

This prior art achieves good detection sensitivity but utilizes a large (>4 mm) xylophone beam. High drive currents (>1A) prevent widespread use in portable and low power devices. The material of choice does not lend this prior art device to be easily integrated with electronics or other sensors. The present invention is based on a quartz MEMS fabrication process which is the subject of U.S. Pat. No. 7,830,074 identified above which has already demonstrated wafer-level integration with electronics.

The prior art also includes:

"A Resonant Micromachined Magnetic Field Sensor," Behraad Bahreyni, and Cyrus Shafai, *IEEE Sensors Journal*, VOL. 7, NO. 9 Sep. 2007.

"A resonant magnetic field microsensor with high quality factor at atmospheric pressure," A L Herrera-May, P J Garcia-Ramirez, L A Aguilera-Cortes, J Martinez-Castillo, A Sauceda-Carvajal, L Garcia-Gonzalez, and E Figueras-Costa, *J. Micromech. Microeng.* 19 (2009) 015016 (11 pp).

"Low Power 3-axis Lorentz Force Navigation Magnetometer," M.J. Thompson, M. Li, and D.A. Horsley, MEMS 2011, Cancun, Mexico, Jan. 23-27, 2011.

"Micromechanical magnetometer using an all-silicon nonlinear torsional resonator," D. Antonio, M. I. Dolz, and H. Pastoriza, *Applied Physics Letters* 95, 133505 2009.

The prior art mentioned above uses silicon resonant structures whose frequency shifts in the presence of a changing magnetic field. While silicon devices can easily be integrated with on-chip electronics, they are prone to large frequency-temperature drifts. Prior art often requires external and often separate drive and detection schemes which increases the complexities and noise. We design the drive and sense mechanisms directly onto the sensing structure enabling a more compact sensor footprint and reduced parasitics. Additionally, directly coupling between the drive and sense mechanisms of our invention greatly improves the signal-to-noise ratio.

Autonomous navigation and attitude heading referencing requires very precise magnetometers with detection limits under 50 nT to achieve an angle resolution of less than 0.1°. SOA magnetometers are forced to compromise between small volume/low power and detection sensitivity. The quartz magnetometer is designed to be one of the first micro-scale magnetometers that will break the 50 nT barrier without sacrificing CSWAP requirements.

In U.S. Provisional Patent Application Serial No. 61/943,213 filed 21 Feb. 2014 and entitled "A Micro-Scale Piezoelectric Resonating Magnetometer" we described a quartz piezoelectric magnetometer based on a rectangular plate or active region wherein the current drive and sensing electrodes are placed. Key to increasing the detection sensitivity of Lorentz force-based magnetometers is to concentrate or maximize the bending stress/ generated by the Lorentz force and position the sensing electrodes at or near the areas of greatest strain. The electrodes detect the strain as a shift in the resonant frequency of the normal quartz thickness shear mode oscillation. One direct method is to increase the Lorentz force that is applied along the front edge of the quartz plate during operation. Ignoring the current propagation along the top and bottom edges of the plate, the Lorentz electromagnetic force equation $$\vec{F}_B = \vec{i} w_{tip} \times \vec{B}$$

is proportional to the current amplitude i, the magnetic field to be measured B, and the length of the current line which is roughly the width of the plate at the free end $w_{tip}$ in the above figure. Simply widening the entire quartz plate to increase the Lorentz force at the tip while maintaining a rectangular shape is not effective as the bending strain is independent of the plate width (the Lorentz force and the plate stiffness increase in proportion with each other, offsetting the effect of increased $w_{tip}$).

U.S. patent application Ser. No. 14/628,182 filed 20 Feb. 2015 claims the benefit of the aforementioned U.S. Provisional Patent Application and includes additional disclosure including a new trapezoidal plate design where the plate width gradually grows from the base to the free end of the plate increases the strength of the Lorentz force while simultaneously concentrating bending strain at the sensitive thickness shear electrodes near the fixed end of the plate, resulting in enhanced sensitivity of the magnetometer to external magnetic field. See Appendix A of U.S. patent application Ser. No. 14/628,182 filed 20 Feb. 2015. Additionally, this new design is capable of detecting AC magnetic fields in addition to DC magnetic fields, within a certain bandwidth of DC (which bandwidth is estimated to be in the range of 20 to 30 Hz).

The plate need not necessarily be trapezoidal. What is important is that (a) the cantilevered plate have a certain width at or near its free end and (b) that the width of the plate at or near where the plate is supported be less than said certain width. With a cantilever design where one side is anchored and the other is free, it is better to maximize the force at the free end to obtain the greatest bending moment. The width is kept relatively narrow at the anchor side to maximize the bending stress.

Figure 4A:
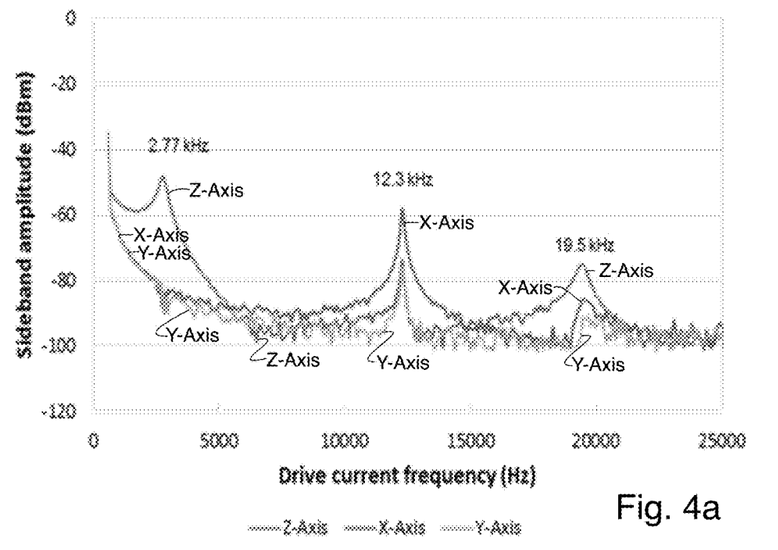
FIG. 4a is a graph of the transfer curves of the quartz magnetometer showing resonance peaks representing the first thee mechanical modes. Cross-axis sensitivity is best when driven at the fundamental flexure mode where the sensitivity to the Z-axis field increases by more than 30 dB. The drive current amplitude is 9.2 mA in this measurement.

An advantage of this design is that it is sensitive to multiple magnetic axes (i.e., a vector magnetometer). For example, FIG. 4 in the detailed description shows that this design can be used to detect both the Z axis magnetic field component (directed along the axis of the plate length) and X axis magnetic field component (directed transversely in-plane to the axis of the plate length). These two magnetic field components can be discriminated because of the frequency separation between the particular plate mode which captures the magnetic field component and their resulting modulation of the quartz thickness shear oscillation. That is, Z axis sensitivity is achieved because the Lorentz force along the plate width at the free end thereof induces the first flexural (diving board) mode of the quartz plate while the X axis sensitivity is achieved by the Lorentz force from an X directed magnetic field component excites the first torsional mode of the quartz plate. Because these modes are well-separated in frequency, it is possible to distinguish between each component of the magnetic field. By exploiting this principle further and optimizing the design of the magnetometer plate and current loop, it is conceivable that a full 3-axis magnetometer can be constructed using a single quartz MEMS device.

BRIEF DESCRIPTION OF THE INVENTION

In one aspect of the invention, a magnetometer is disclosed which has an resonating structure which preferably comprises a quartz plate having an active portion with a distal end which is wider than a point at which the active portion of the quartz plate attaches to a base portion thereof. The active portion may assume a cantilevered or tee shape, for example. A loop electrode closely follows the edges of the active portion of the disclosed sensor and, in use, a AC signal may be applied thereto. Sense electrodes are disposed on top and bottom surfaces of the quartz plate near or at said point at which the active portion of the quartz plate attaches to the base portion thereof.

In another aspect the invention provides a resonator comprising a resonating structure which is naturally resonant in at least one resonant mode, the resonating structure being significantly wider at a free end thereof than it is at a fixed end thereof, the resonating structure having at least one pair of sense electrodes disposed on opposing major surfaces of the resonating structure and having a conductive path formed as a loop, the loop being disposed near or at edges of the resonating structure so that said loop follows a path which is significantly wider at the free end of said resonating structure than it is at the fixed end of said resonating structure and wherein the at least one pair of sense electrodes are disposed inwardly of the edges of the resonating structure and also inwardly of the path of said loop.

BRIEF DESCRIPTION OF THE DRAWINGS

FIG. 1c is a side sectional view taken along line 1c-1c of the embodiment of a quartz micro-magnetometer with a trapezoidally shaped quartz resonant plate of FIG. 1a.

DETAILED DESCRIPTION

Figure 1A:
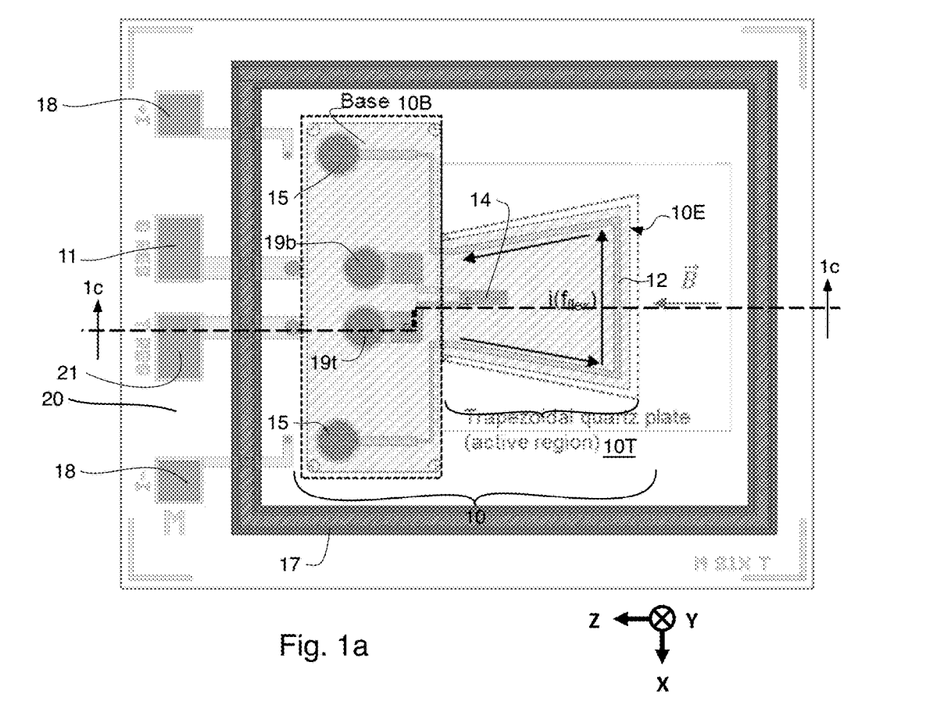
FIG. 1a depicts a plan view of an embodiment of a quartz micro-magnetometer having a trapezoidally shaped quartz resonant plate.

FIG. 1a is a top or plan view of an embodiment of a quartz magnetometer in accordance with one aspect of the present invention, this embodiment having a quartz plate with a base portion 10B and an integral active region 10T, which, in this embodiment, is formed with a trapezoidal shape (see the dashed outline on the right hand side of this figure). The active region of the quartz plate provides a resonating structure. Unlike a standard rectangular plate where the width of its active portion remains constant along the entire length of the active portion of the plate (along the horizontal axis Z), this singly clamped trapezoidal plate 10T widens along the plate's length starting from its fixed end or base 10B (see the dashed outline on the left hand side of this figure) and reaches a maximum width at the tip or free end of the plate 10E.

Figure 1B:
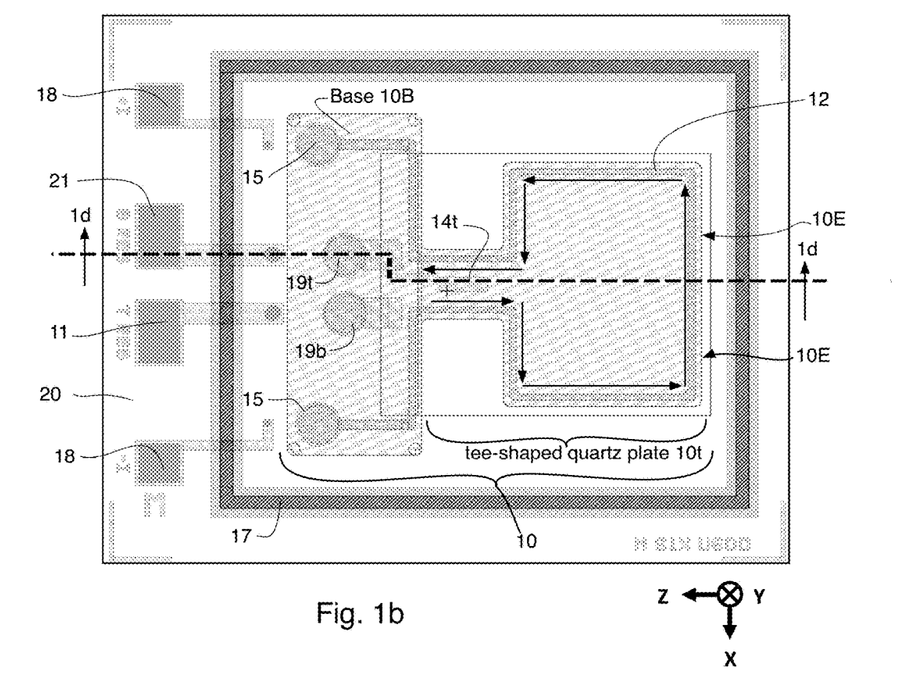
FIG. 1b depicts a plan view of another embodiment of a quartz micro-magnetometer having a tee shaped quartz resonant plate.
Figure 1C:
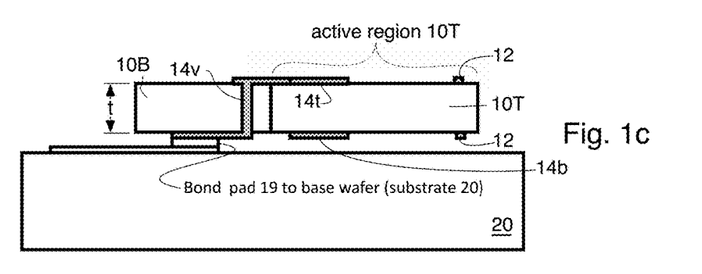

This trapezoidal shape of the embodiment of FIG. 1a allows for a longer current path or loop 12 (current flows around the current loop 12, which is preferably formed by a metal loop disposed near the edges of the trapezoidal plate 10T as shown in FIG. 1a, where the current flow is signified by the lines with arrowheads) compared to using a rectangular plate magnetometer, thereby ensuring an increase in the Lorentz force without introducing deleterious effects. The current loop 12 may be disposed on either the top or bottom surfaces (or one both the top and bottom surfaces) of the trapezoidal plate 10T. FIG. 1c is a side sectional view taken along line 1c-1c of the embodiment of a quartz micro-magnetometer of FIG. 1a and this side section view shows a portion of the loop 12 on both the upper and lower surfaces of the trapezoidal plate 10T. The quartz magnetometer has two sense electrodes 14, an electrode 14t disposed on the top surface of the trapezoidal quartz plate 10T and an opposing electrode 14b disposed on the bottom surface of the trapezoidal quartz plate 10T. The current loop 12 may be disposed on the bottom surface of the quartz plate 10 instead of the top surface so that vias through the quartz plate 10 to conduct current to the current loop 12 from the substrate 20 on which the magnetometer is mounted would then not be needed. Alternatively, a current loop 12 may be disposed on each of the top and bottom surfaces of the quartz plate 10, which loops 12 would then connected in parallel. The current loop 12 needs to be electrically conductive and thus it and the electrodes 14a and 14b are preferably formed of a metal material which is preferably deposited on the quartz plate 10.

Figure 1D:
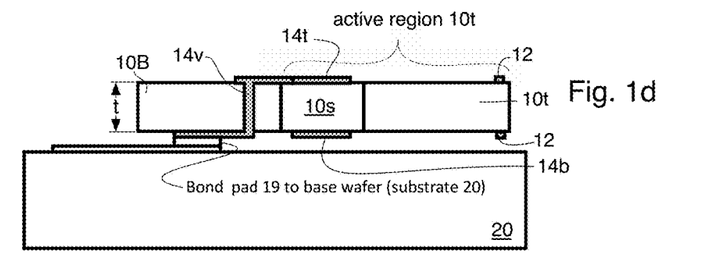
FIG. 1d is a side sectional view taken along line 1d-1d of the embodiment of a quartz micro-magnetometer with a tee shaped quartz resonant plate of FIG. 1b.

FIG. 1c is a top or plan view of another embodiment of a quartz magnetometer in accordance the present invention, this embodiment having tee-shaped a quartz plate 10t (see the dashed outline on the right hand side of this figure). Unlike a rectangular plate where the width of its active portion remains constant along the length of the active portion of the plate (along the horizontal axis Z), this singly clamped, tee-shaped plate 10t has a narrow neck at the stem 10s of the tee (which stem 10s is attached to and is preferably integral with the base portion 10B) and then the width of the tee-shaped plate 10t widens to a maximum width and remains at that width to the tip or free end of the plate 10E. This tee-shape allows for a longer current line or loop 12 (current flows around the metal current loop disposed on the surface of the quartz plate 10 as shown in FIG. 1c and is signified by the lines with arrowheads) compared a standard rectangular plate magnetometer, thereby ensuring a significant increase in the Lorentz force without introducing deleterious effects. FIG. 1d is a side sectional view taken along line 1d-1d of the embodiment of a quartz micromagnetometer of FIG. 1c. The quartz magnetometer has two sense electrodes, namely, an electrode 14t disposed on the top surface of the tee-shaped quartz plate 10t and an opposing electrode 14b disposed on the bottom surface of the tee-shaped quartz plate 10t.

The longer current line 12 at the free end 10E of the trapezoidal quartz plate 10T or the tee-shaped plate 10t will effectively increase the Lorentz force that is applied along the free end 10E compared to a straight-edged prior art rectangular quartz plate. The metal current loop 12 completes the circuit between the +I and the −I bond pads 18 used to interface to the quartz MEMS magnetometer device to a semiconductor substrate 20. Metal vias (not shown) are used, as needed, to bridge the connection between the different metal layers in the out of plane direction when completing the +I to −I loop. The top sense electrode 14t is coupled using a via 14v and a bond pad to substrate bond 19t to connect to a bond pad 21 on the semiconductor substrate 20. Other bond pad to substrate bonds 15 connect either the loop electrodes to pads 18 and bond pad to substrate bond 19b connects the bottom sense electrode 14b to pad 11 on the semiconductor substrate 20.

The sensing mechanism of the quartz magnetometer relies on the induced bending strain on the quartz plate by an applied Lorentz force generated from the interaction between the magnetic field and the embedded AC current loop formed by deposition and patterning of the metal layer loop 12 on the quartz plate 10. The bending strain at the sense electrodes 14t and 14b is then detected by a change in resonance of an acoustic mode in the quartz plate 10. In other words, the sensing mechanism is based on the acoustic coupling between two resonant modes where one mode is driven into mechanical vibration by the sinusoidal Lorentz force induced by a low frequency AC current applied to loop 12 and a second higher frequency mode (excited by an RF signal applied to electrode pair 14) detects the vibration in the form of a frequency shift in the thickness shear mode at the sense electrodes 14t and 14b. This frequency shift is represented as a frequency modulation of higher frequency (generally UHF for this example) mode whose sideband amplitude can then be correlated back to the magnetic field strength. The frequency offset between the sideband and the carrier frequency is exactly the frequency of drive current and the flexure mode induced by the Lorentz force.

For example, the carrier frequency at UHF (~300 MHz above depending on the thickness t of the quartz) is the thickness shear mode resonance excited by injecting an RF frequency signal at the sense electrodes 14t and 14b. Without a drive current being applied to loop 12, the output frequency of this device and from an oscillator circuit formed in the semiconductor substrate 20 will remain at the aforementioned 300 MHz or above. But if a separate ac drive current is applied to the loop-at a frequency of 2.77 kHz which in conjunction with the magnetic field to be measured will excite the beam 10 in a second resonance mode, the flexure mode. The beam 10 acts to frequency mix the thickness shear at 583 MHz and the flexure mode at 2.77 kHz resulting in the sidebands that can be seen in FIG. 3.

The coupling mechanism is between the driven flexure mode and the sensing thickness-shear as is described in U.S. patent application Ser. No. 14/997,423 filed on the same date as this application and entitled "A Piezoelectric Magnetometer Capable of Sensing a Magnetic Field in Multiple Vectors". Alternatively, the drive mode can be higher frequency torsional mode as is explained in the aforementioned U.S. Patent Application.

Figure 2:
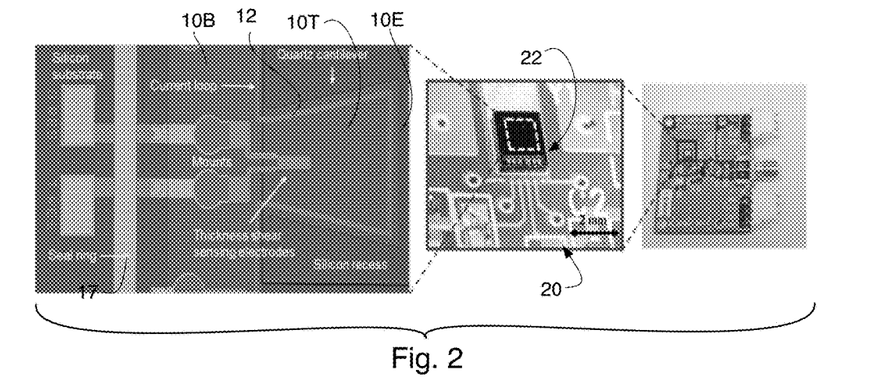
FIG. 2 depicts three optical images of the various assembly stages of an embodiment the magnetometer: a fabricated quartz magnetometer on silicon base substrate can be seen on the left of FIG. 2, a packaged magnetometer on disposed on a Printed Circuit Board (PCB) can be seen in the center of FIG. 2 while a complete oscillator circuit (see FIG. 2a for its schematic) with integrated quartz resonant magnetometer is depicted on the right of FIG. 2.
Figure 2A:
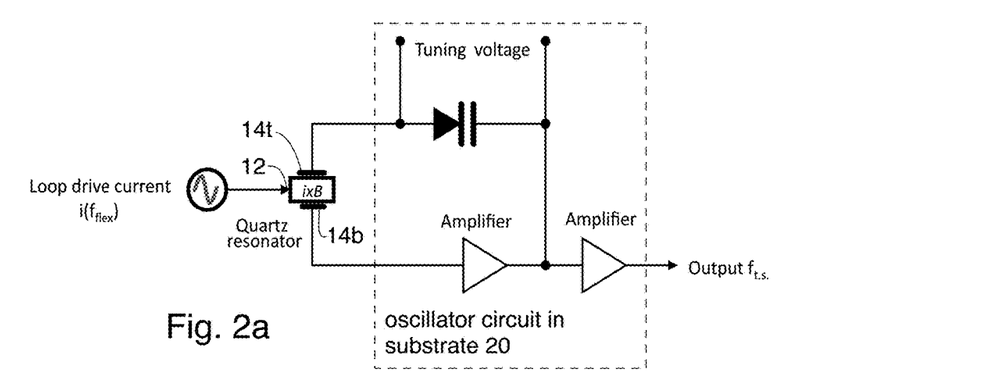
FIG. 2a is a schematic diagram of an oscillator circuit which may be used with the magnetometer of the present invention.

An embodiment of a quartz MEMS magnetometer with an active region comprising a trapezoidal quartz plate has been reduced to practice as shown in FIG. 2. The magnetometer is based on a quartz UHF micro-resonator platform with an additional metal line alongside the electrodes to form the current loop 12. The singly clamped trapezoidal plate 10T attaches to a wider rectangular quartz base 10B which is then directly attached to the substrate at multiple anchor or bond points 15, 19t & 19b. The width of the trapezoidal portion 10T quartz plate 10 increases between the base 10B and the free end 10E such that the width at the free end 10E is wider than the width of the trapezoidal portion 10T adjacent the base 10B. The sensing electrodes 14t and 14b are preferably strategically placed on the two major surfaces of the trapezoidal portion 10T of the quartz plate 10 close to the base portion 10B where maximum bending stress/ strain should occur. The magnetometer is preferably vacuum encapsulated along a seal ring 17 through wafer-level bonding and singulated (assuming multiple magnetometers are made at the same time from a single sheet of quartz) into discrete dies 22 (each bearing preferably one magnetometer) and mounted onto an oscillator circuit formed in substrate 20 (see FIG. 2a for its schematic).

Figure 3:
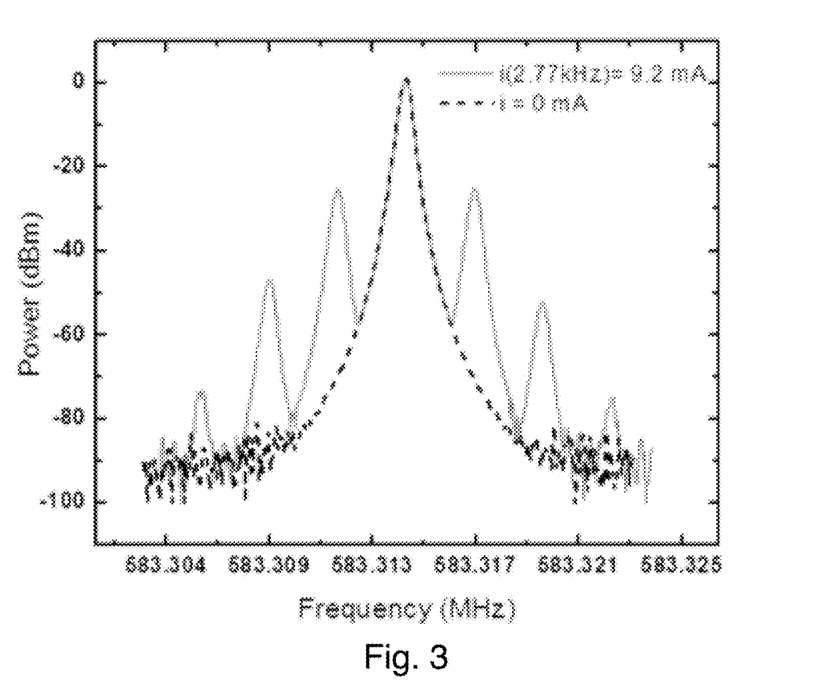
FIG. 3 is a graph of the output of the quartz thickness shear oscillator circuit when no AC current is applied to the current loop is 0 dBm (the dashed line) but −25 dBm FM sidebands and harmonics (solid lines) are generated when the applied DC magnetic field couples with the AC drive current at 2.77 kHz.

FIG. 3 shows two separate power spectrums taken with a spectrum analyzer. The traces represent the oscillator output with and without the AC drive current in the current loop. In the absence of the current (see the dotted line), we see a resonance peak at 583 MHz representing the unmodulated thickness shear mode oscillation. When driven with an AC current signal (i=9.2 mA), the oscillator signal is frequency modulated by the flexure mode vibration induced by the AC current and magnetic field resulting in a series of sidebands up to $3*\omega_{flexure}$ (3*2.77 kHz) before dropping below the spectrum analyzer noise floor. The side band frequency (frequency offset from the oscillation peak at 583.315 MHz) represents the fundamental flexure mode resonance at 2.77 kHz. As predicted and observed on the spectrum analyzer screen, the side band amplitudes change proportionally with drive current amplitude and magnetic field strength in accordance with the Lorentz force law.

Figure 4B:
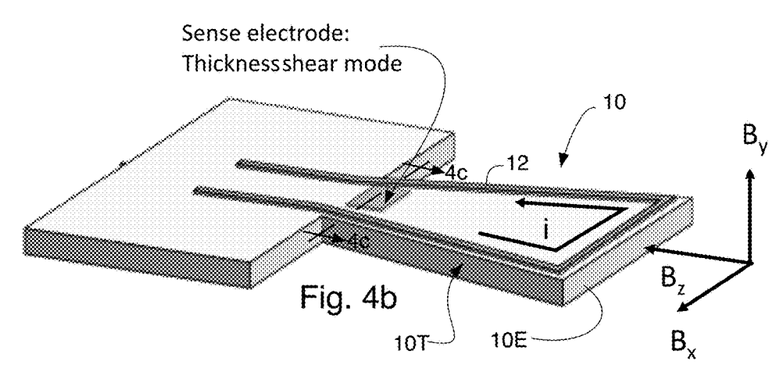
FIG. 4b is a representation of a trapezoidal embodiment of a quartz plate to illustrate direction of the magnetic fields.
Figure 4C:
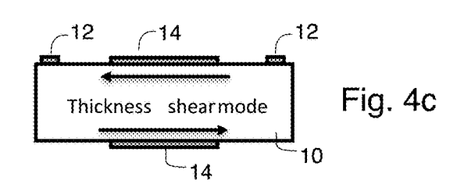
FIG. 4c is a cross section view thru the trapezoidal embodiment of a quartz plate taken along lines 4c-4c of FIG. 4b.

FIG. 4a shows the transfer curves of the trapezoidal quartz micro-magnetometer in a Helmholtz coil test stand where the magnetic field strength and direction can be precisely controlled. For each trace, the magnetic field is generated along each of the three orthogonal axes of the Helmholz coil, and the AC drive current frequency around the current loop is swept from DC to 25 kHz. The amplitude of the first side band as shown in the previous figure is recorded as a function of the drive current frequency. The resonance peaks at 2.77, 12.3, and 19.5 kHz represent the fundamental flexure, fundamental torsional, and second-order flexure modes respectively. Driven at the fundamental flexure mode at 2.77 kHz, the quartz magnetometer exhibits excellent detection sensitivity (1.6 V/T) when the field is along the Z-axis. Cross axis sensitivity is also enhanced with more than 30 dB difference between the preferred Z-axis and the remaining two X and Y axes. The magnetometer is most sensitive to the X-axis field when driven into torsional resonance at 12.3 kHz. FIG. 4b shows a trapezoidal embodiment of quartz plate 10 to illustrate direction of the magnetic fields and the x,y & z axes as those relate to FIG. 4a. FIG. 4c is a cross section view thru the trapezoidal embodiment of a quartz plate taken along lines 4c-4c of FIG. 4b.

Figure 5:
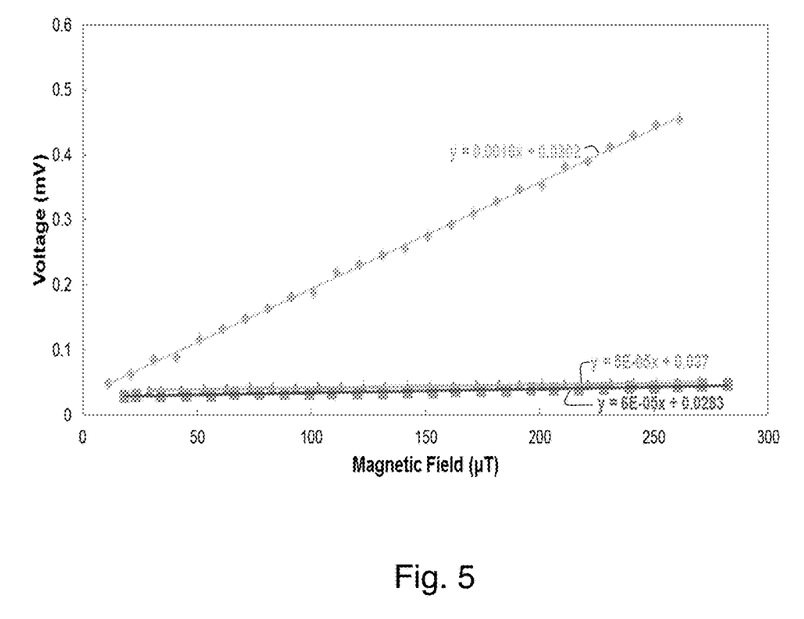
FIG. 5 demonstrates that the magnetometer sensitivity is greatest for the z-component of the magnetic field when the sensor is driven at 2.77 kHz to excite the fundamental flexure mode. The Bz sensitivity is 1.6 V/T, roughly two orders of magnitude greater than the sensitivities towards the x and y components of the magnetic field.

Sensitivity measurements were taken from the first FM sideband amplitude along the three magnetic field axes and are shown in FIG. 5. The magnetic field generated by the Helmholtz coils was directed along the three orthogonal axes with the field strength varying from 10 uT to 260 uT. The drive current was set at a fixed value of i=9 mA and f=2.77 kHz. The calculated sensitivities are 1.6, 0.06, and 0.05 V/T along the z, x, and y axes respectively.

The foregoing Detailed Description of exemplary and possibly preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom.

Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable.

Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims.

No claim element herein is to be construed under the provisions of 35 U.S.C. § 112(f), unless the element is expressly recited using the phrase "means for . . . " and no method or process step herein is to be construed under those provisions unless the step, or steps, are expressly recited using the phrase "comprising the step(s) of . . . ".

What is claimed is:

1. A magnetometer comprising a resonating structure which is naturally resonant in at least one resonant mode, the resonating structure being significantly wider at a free end thereof than it is at a fixed end thereof, the resonating structure having at least one pair of sense electrodes disposed on opposing major surfaces of the resonating structure and having a conductive path formed as a loop, the loop being disposed near or at edges of the resonating structure and the at least one pair of sense electrodes being formed inwardly of the edges of the resonating structure and also inwardly of the path of said loop so that, in use, when a first oscillating current is applied to said loop and a second oscillating current is applied to the sense electrodes, and further when said resonator encounters an external magnetic field, the external magnetic field causes sidebands to be generated in said second oscillating current, the sidebands being indicative of the strength of the external magnetic field.

2. The magnetometer of claim 1 wherein the resonating structure is formed of a piezoelectric material.

3. The magnetometer of claim 2 wherein the piezoelectric material is a single crystal of quartz.

4. The magnetometer of claim 1 wherein the resonating structure smoothly widens from the fixed end thereof to the free end thereof.

5. The magnetometer of claim 1 wherein the resonating structure has, at least in part, a trapezoidal shape.

6. The magnetometer of claim 5 wherein the loop has, at least in part, a trapezoidal shape.

7. The magnetometer of claim 1 wherein the resonating structure has, at least in part, a tee-shaped portion.

8. The magnetometer of claim 1 wherein at least one pair of sense electrodes are disposed on the resonating structure near or at said fixed end of the resonating structure.

9. The magnetometer of claim 1 wherein, in use, an out-of-plane force is generated on the resonating structure.

10. The magnetometer of claim 9 wherein, in use, the resonating structure exhibits flexure-mode deflection.

11. The magnetometer of claim 10 wherein, in use, the resonating structure exhibits thickness-shear vibration which changes in response to the magnetic field.

12. A resonator comprising a resonating structure which is naturally resonant in at least one resonant mode, the resonating structure being significantly wider at a free end thereof than it is at a fixed end thereof, the resonating structure having at least one pair of sense electrodes disposed on opposing major surfaces of the resonating structure and having a conductive path formed as a loop, the loop being disposed near or at edges of the resonating structure and the at least one pair of sense electrodes being disposed inwardly of the loop and wherein, in use, a first oscillating current is applied to said loop and a second oscillating current is applied to the sense electrodes, and when said resonator encounters an external magnetic field the external magnetic field causes sidebands to be generated in said second oscillating current, the sidebands being indicative of the strength of the external magnetic field.

13. The resonator of claim 12 wherein the resonating structure is formed of a piezoelectric material.

14. The resonator of claim 13 wherein the piezoelectric material is a single crystal of quartz.

15. The resonator of claim 12 wherein the resonating structure smoothly widens from the fixed end thereof to the free end thereof.

16. The resonator of claim 12 wherein the resonating structure has, at least in part, a trapezoidal shape.

17. The resonator of claim 16 wherein the loop has, at least in part, a trapezoidal shape.

18. The resonator of claim 12 wherein the resonating structure has, at least in part, a tee-shaped portion.

19. The resonator of claim 12 wherein the at least one pair of sense electrodes are disposed on opposing major surfaces of the resonating structure near or at said fixed end of the resonating structure.

20. The resonator of claim 12 wherein the at least one pair of sense electrodes are disposed closer to the fixed end of the resonating structure than to the free end thereof.

21. The resonator of claim 12 wherein the loop has, at least in part, a trapezoidal shape.

22. A resonator comprising a resonating structure which is naturally resonant in at least one resonant mode, the resonating structure being significantly wider at a free end thereof than it is at a fixed end thereof, the resonating structure having at least one pair of sense electrodes disposed on opposing major surfaces of the resonating structure and having a conductive path formed as a loop, the loop being disposed near or at edges of the resonating structure so that said loop follows a path which is significantly wider at the free end of said resonating structure than it is at the fixed end of said resonating structure and wherein the at least one pair of sense electrodes are disposed inwardly of the edges of the resonating structure and also inwardly of the path of said loop, and wherein, in use, a first oscillating current is applied to said loop and a second oscillating current is applied to the sense electrodes, and when said resonator encounters an external magnetic field the external magnetic field causes sidebands to be generated in said second oscillating current, the sidebands being indicative of the strength of the external magnetic field.

\* \* \* \* \*